United States Patent [19]
Edwards

[11] Patent Number: 5,285,175
[45] Date of Patent: Feb. 8, 1994

[54] TRI-PHASE COMBINER/SPLITTER SYSTEM

[75] Inventor: Richard C. Edwards, Cedar Rapids, Iowa

[73] Assignee: Rockwell International, Seal Beach, Calif.

[21] Appl. No.: 939,783

[22] Filed: Sep. 3, 1992

[51] Int. Cl.$^5$ .......................... H01P 6/12; H01P 5/18
[52] U.S. Cl. .................................. 333/109; 333/28 R
[58] Field of Search ............... 333/109, 112, 115, 116, 333/28 R, 113, 114

[56] References Cited

U.S. PATENT DOCUMENTS

| | | | |
|---|---|---|---|
| 4,323,863 | 4/1982 | Weber | 333/109 |
| 4,394,629 | 6/1983 | Kumar et al. | 333/109 |

Primary Examiner—Robert J. Pascal
Assistant Examiner—Darios Gambino
Attorney, Agent, or Firm—Kyle Eppele; M. Lee Murrah; H. Fredrick Hamann

[57] ABSTRACT

A tri-phase combiner/splitter system that has similar advantages to presently available binary combiner/splitter systems which uses quadrature couplers. Notably, the combiner input Voltage Standing Wave Ratio ("VSWR") remains at 1:1 for identical mismatch impedance at the output ports. There is also a complete cancellation of back-door intermodulation components for identical output device nonlinearities. An innovative wideband, 0° three way combiner/splitter is the basic building block of the present invention. To achieve equal port impedances, a new wideband transmission line transformer is used. By using 60° or 120° phase equalization networks at the three, 0° output ports, this device is converted to a wideband tri-phase combiner.

For moderate bandwidths, a coupled transmission line version is possible using meandering strip lines in the same fashion used in quadrature coupler design. A new transmission line phase compensation technique is also accomplished using meandering strip lines.

4 Claims, 6 Drawing Sheets

FIG. 5A
FRONT VIEW

FIG. 5B
REAR VIEW

FIG. 6A
FRONT VIEW

FIG. 6B
REAR VIEW

TRI-PHASE COMBINER/SPLITTER SYSTEM

BACKGROUND OF THE INVENTION

This invention relates to electrical combiner/splitter systems and more specifically to tri-phase combiner/splitter systems for high power amplifier applications.

Numerous modern day applications require power levels that greatly exceed the capability of commercially available individual devices. Common practice by those skilled in the art is to couple a plurality of devices in a network fashion thereby yielding the desired output. Typically, the input power is split and delivered to several devices via a dividing network. The output power of these devices is collected via a combining network to generate a larger output power level. Such a system is often referred to as an n-way amplifier, where n represents the number of amplifier devices utilized in the network. By using combiner/splitter networks, an n-way amplifier can be built from n individual amplifiers to obtain a theoretical output of n times the output power of the individual amplifiers in the system.

Two popular combiner/splitter networks are the chain and corporate structures. The chain structure resembles a collection of devices coupled in cascade fashion. The chain structure offers the advantage of ease of changing the number of ports in the network. To add a port to an existing structure, a coupler having a predetermined coupling coefficient is added to the chain with all other couplers remaining unchanged. A limitation of the chain structure is the difficulty of building couplers having high coupling coefficients when large numbers of sources are combined. Some couplings are too weak for branch-line couplers or split-T couplers and some are too strong for parallel line couplers. The corporate structure is not as flexible as the chain structure and generally resembles a combination of numerous outputs converging into a single device output. The corporate structure usually offers less coupling loss and hence higher efficiency as the number of combining sources increases than the chain structure.

There exists a need for a combiner/splitter network having components and configuration that yield favorable output for wideband operations.

SUMMARY OF THE INVENTION

The present invention comprises a tri-phase combiner/splitter system that has similar advantages to presently available binary combiner/splitter systems which use quadrature couplers. Notably, the combiner input Voltage Standing Wave Ratio ("VSWR") remains at 1:1 for identical mismatch impedance at the output ports. There is also a complete cancellation of back-door intermodulation components for identical output device nonlinearities. An innovative wideband, 0° three way combiner/splitter is the basic building block of the present invention. To achieve equal port impedances, a new wideband transmission line transformer is used. By using 60° or 120° phase equalization networks at the three, 0° output ports, this device is converted to a wideband tri-phase combiner.

For moderate bandwidths, a coupled transmission line version is possible using meandering strip lines in the same fashion used in quadrature coupler design. A new transmission line phase compensation technique is also accomplished using meandering strip lines.

It is an object of the present invention to provide a tri-phase combiner/splitter network having suitable use for wideband operations.

It is another object of the present invention to provide a wideband transmission line transformer of use in combiner/splitter network.

It is yet another object of the present invention to provide a transmission line phase compensation technique.

It is a feature of the present invention to utilize a 0° three-way combiner/splitter as a basic building block of a larger network.

It is yet another feature of the present invention to utilize a wideband transmission line transformer in a combiner/splitter network.

It is an advantage of the present invention to provide a combiner/splitter independent of the electrical length of its transmission lines.

It is an additional advantage to utilize a broadband transformer having operating parameters within one percent of its ideal turns ratio.

It is yet an additional advantage of the present invention that a tri-phase combiner/splitter having a reflection coefficient $P_{IN}$ equal to zero.

These and other objects, features and advantages are disclosed and claimed in the specification, figures and claims of the present application.

BRIEF DESCRIPTION OF THE DRAWINGS

FIG. 5 A and B depict schematic diagrams of the front and rear view, respectively, of an unbalanced feed, 3-port combiner/splitter with unlimited bandwidth capability.

FIG. 6 A and B depict schematic diagrams of the front and rear view, respectively, of a balanced feed, 3-port combiner/splitter with unlimited bandwidth capability.

FIG. 11 A, B and C show schematic diagrams of the 0°, 0°, or 120° phase equalizer for use in the present invention.

DETAILED DESCRIPTION OF THE FIGURES

Figure 1:
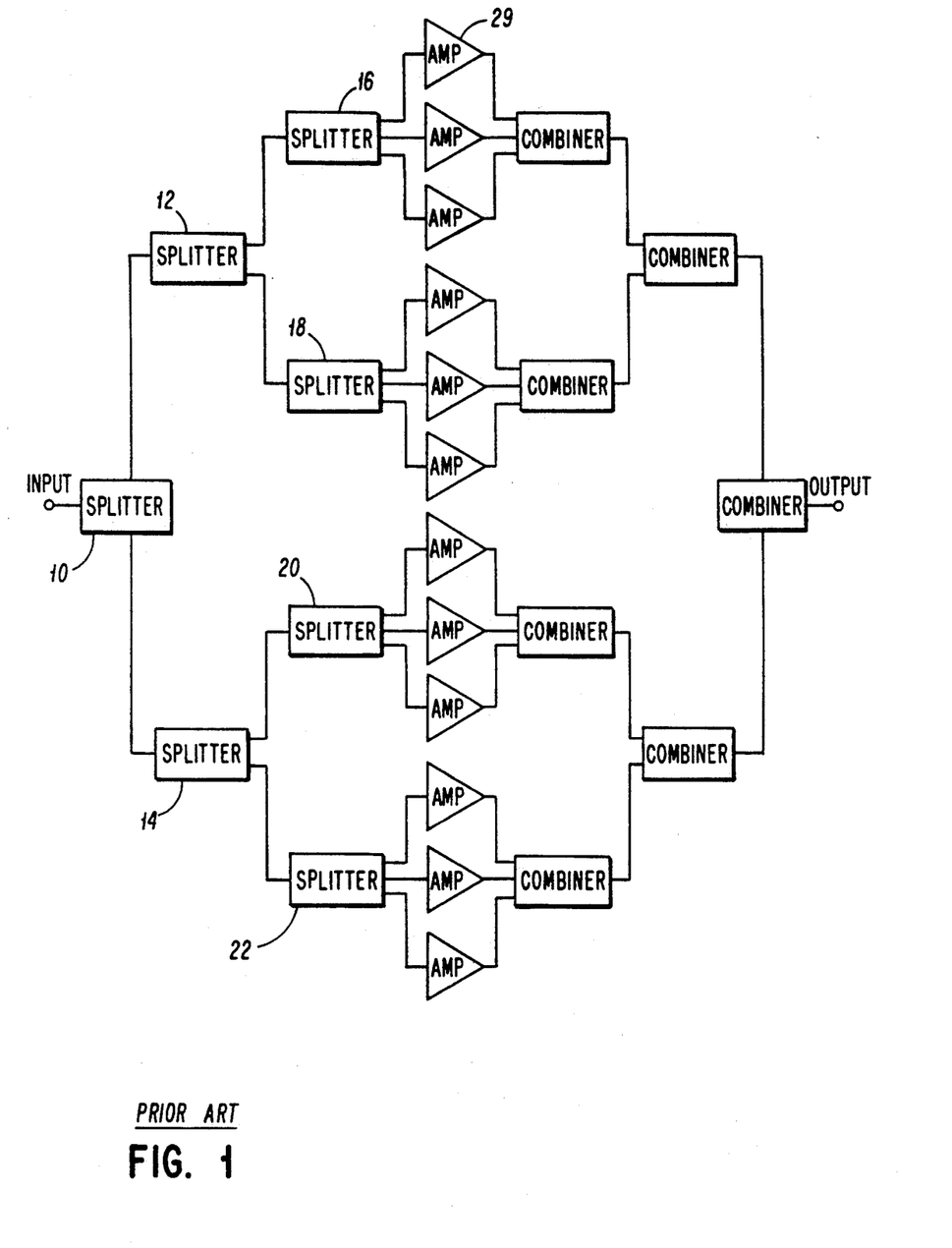
FIG. 1 is a block diagram of a representative combiner/splitter system.

Referring now to the Figures where like items are referenced as such throughout, FIG. 1 shows a mixed corporate structure network 5 of two and three port combiners/splitters that provide greater design flexibility than commonly used binary systems. The network of FIG. 1 has a first 2-port splitter 10 having dual outputs which are coupled as inputs to a second and a third 2-port splitter, 12 and 14 respectively. The dual outputs of splitters 12 and 14 each serve as an input to a first, second, third and fourth 3-port splitter, 16, 18, 20 and 22 respectively. The outputs from the 3-port splitters are coupled individually as input to twelve amplifiers 24. The power combiner/splitter ratios for all combinations of 2-port and 2-, 3-port devices such as depicted in FIG. 1 are set forth in Table 1 below.

TABLE 1

| 2-Port Combiners $P_{OUT}/P_{IN}$ | 2-, 3-Port Combiners $P_{OUT}/P_{IN}$ |
|---|---|
| 2 | 2 |
|   | 3 |
| 4 | 4 |
|   | 6 |
| 8 | 8 |
|   | 9 |
|   | 12 (See FIG. 1) |
| 16 | 16 |
|   | 18 |
|   | 24 |
|   | 27 |
| 32 | 32 |
|   | 36 |
|   | 48 |
|   | 54 |
| 64 | 64 |
|   | 72 |
|   | 81 |
|   | 108 |
| 128 | 128 |

The outputs of amplifiers 24 are systematically coupled into a single single through the same devices 10-22 now utilized as combiners. The output of network 5 is a signal amplified by the value of the input signal to device 10 multiplied by the power gain of each amplifier 24 less losses due to combining and splitting. Note also that a 0°, 4-port combiner/splitter may be used in place of the three 2-port combiners, 10, 12 and 14. Moreover, the tri-phase output combiners achieve back door intermodulation cancellation when either the 0°, 4-port or three 2-port combiner/splitter is used.

Figure 2:
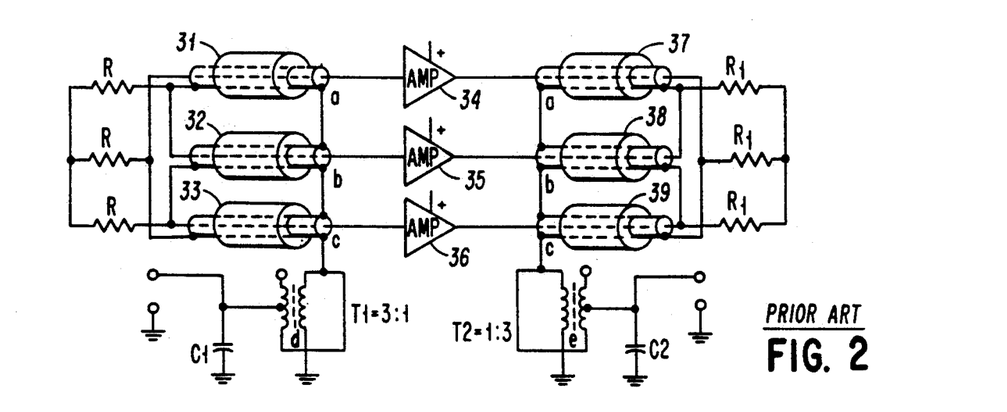
FIG. 2 is a block diagram of a 3-port combiner/splitter system as known in the prior art.

FIG. 2 depicts a 3-port combiner/splitter as known in the prior art. An input signal is coupled through a first transformer T1 which in turn is coupled through a first, second and third transmission line couplers 31, 32 and 33 and resistors R. The output of each transmission line coupler serves as an input to a first, second and third amplifier 34, 35 and 36 respectively. The amplifier outputs are coupled through a fourth, fifth and sixth transmission line couplers 37, 38, and 39, resistors R1, and transformer T2 resulting in output signal.

Figure 3:
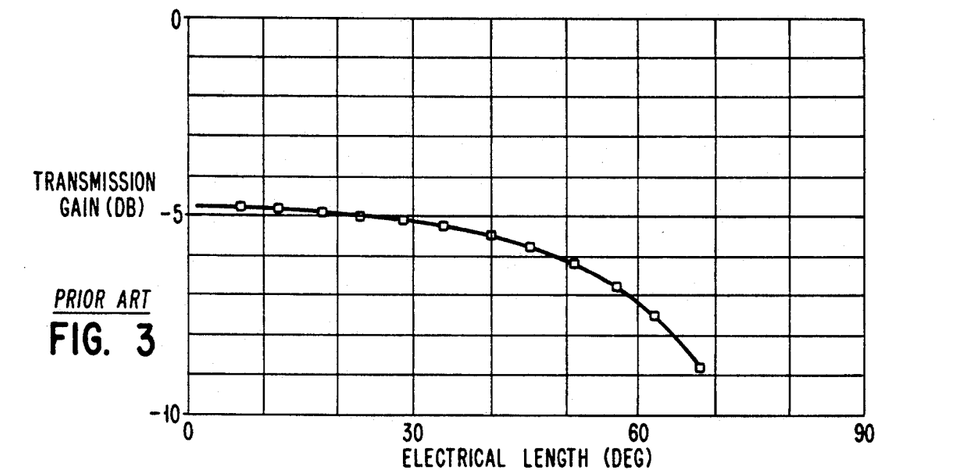
FIG. 3 is a graph of gain in dB plotted over electrical length in degrees for the combiner/splitter of FIG. 2.
Figure 4:
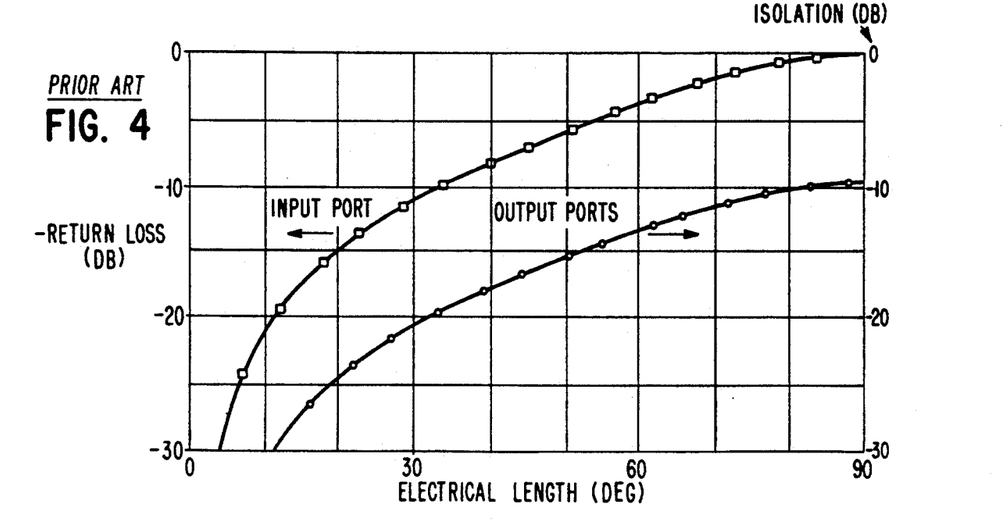
FIG. 4 is a graph of the return loss in dB over electrical length in degrees for the input and output ports of the combiner/splitter of FIG. 2.

A computer analysis of performance characteristics of the device of FIG. 2 is depicted in FIGS. 3 and 4. FIG. 3 illustrates a plot of the transmission gain versus the electrical length for the device of FIG. 2. FIG. 4 illustrates plots of the return loss versus electrical length at the input port and output ports of the device of FIG. 2. FIG. 3 shows the ideal splitting transmission gain 20 log $|S21|$, approaching −4.77 dB at small electrical line lengths, but for less than 1 dB degradation in 20 log $|S21|$ the electrical length must be less than 46°. Furthermore, FIG. 4 shows that for 20 dB isolation between ports the lines must be less than 33°. And for a reasonable return loss, −20 log $|S11|$, of 20 dB (ie. a VSWR of 1.2:1) at the ideal transformer interface, the electrical line length must be less than 12°.

An analysis of the graphs of FIGS. 3 and 4 indicates that for acceptable combiner/splitter performance the electrical length of the coaxial lines must be less than 12° at the highest frequency of operation. These coaxial lines are typically wound around ferrite cores so the physical size of the cores must be small enough to accommodate this winding length. Since the size of the cores must increase for high power applications for this 3-port combiner/splitter is said to be power/frequency limited. The proposed 3-port combiner/splitter described next eliminates this problem.

It should be noted that an optimum ferrite/iron core material is required to suppress the unwanted even mode currents of the coaxial lines. Stated another way, the winding inductance must be sufficiently high not to degrade the lowest frequency of operation.

Figure 5A:
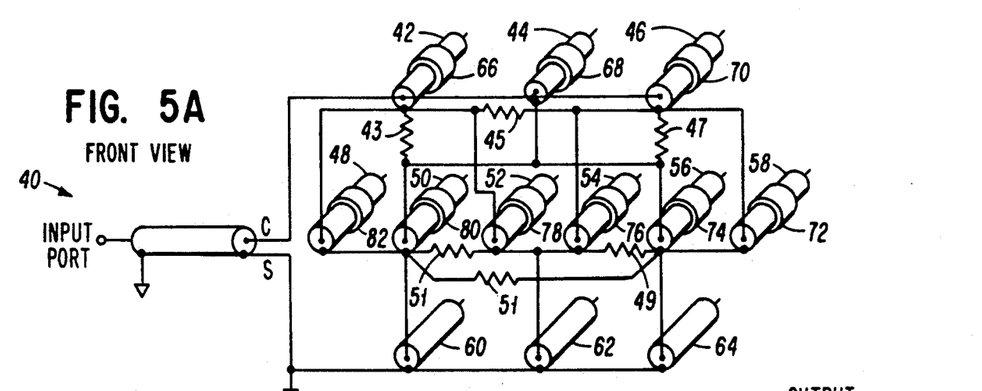
Figure 5B:
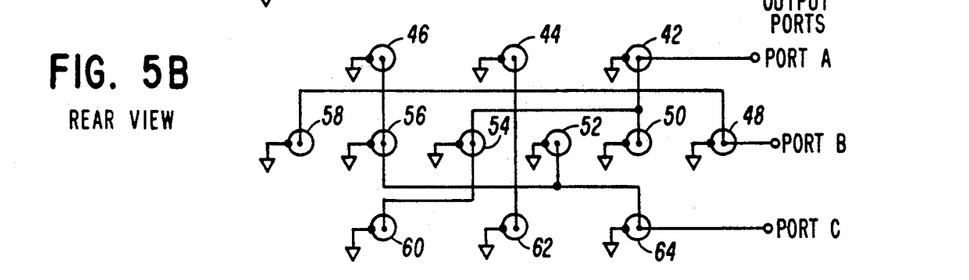

An unbalanced feed, combiner/splitter device incorporating the teachings of the present invention is depicted in FIG. 5. The device configuration depicts an input port 40, twelve coaxial transmission lines which are of equal length arbitrarly selected 42-64 and six resistors 43-53, front and rear view respectively. Ferrite sleeves 66-82 are coupled onto transmission lines 42-58 in order to suppress currents due to finite even-mode impedances from the center nodes of the configuration to ground which occur whenever the outer conductor of a coaxial cable is grounded on one end but not on its opposite end.

Unlike the combiner/splitter performance graphs shown in FIGS. 3 and 4, the proposed ideal combiner/splitter, shown in FIG. 5 has a 20 log $|S21|$ value equal to −4.77 dB independent of electrical length of transmission lines 42-64. Likewise, the isolation between the 3 output ports remains at infinite dB and the input VSWR is 1:1 (the return loss remains at infinity in FIG. 3) independent of electrical length. Therefore, for large bandwidths or power requirements, the proposed unit results in significant performance improvement over the prior art.

Figure 6A:
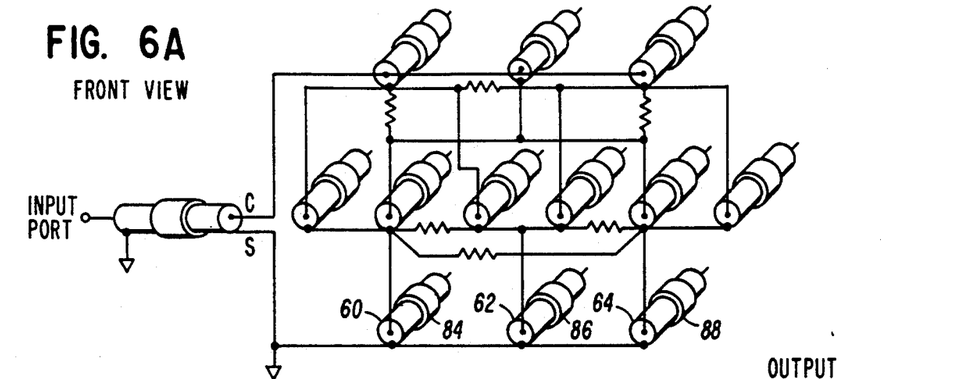
Figure 6B:
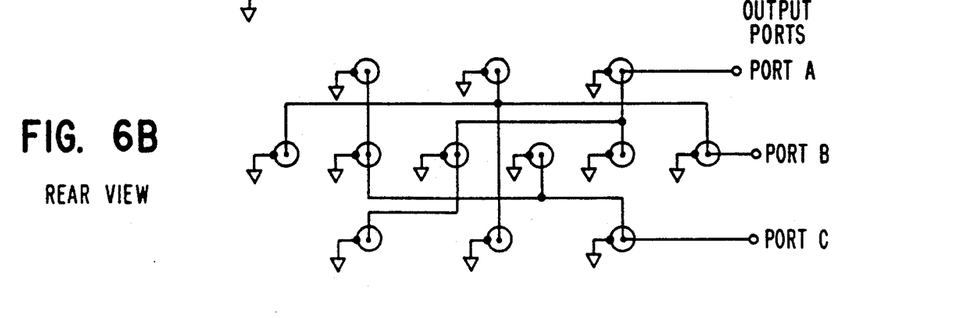

A balanced feed version of the ideal combiner/splitter is shown in FIG. 6. In addition to the configuration described for FIG. 5, ferrite sleeves 84-88 are required on transmission lines 60-64. Table 2 contains the component values for the networks of FIGS. 5 and 6.

TABLE 2

| Required Impedance Values | | |
|---|---|---|
| Input Port | = $R_S$ | = 50.00 Ohms |
| Port-1 | = $R_S/3$ | = 16.67 Ohms |
| Port-2 | = $R_S/3$ | = 16.67 Ohms |
| Port-3 | = $R_S/3$ | = 16.67 Ohms |
| Dump Resistors R | = $2*R_S$ | = 100.00 Ohms |
| Transmission Lines 42, 64 | = $R_S$ | = 50.00 Ohms |
| Transmission Lines 50, 54 | = $2*R_S$ | = 100.00 Ohms |
| Transmission Lines 44, 62 | = $R_S$ | = 50.00 Ohms |
| Transmission Lines 48, 58 | = $2*R_S$ | = 100.00 Ohms |
| Transmission Lines 46, 60 | = $R_S$ | = 50.00 Ohms |
| Transmission Lines 52, 56 | = $2*R_S$ | = 100.00 Ohms |

Note that the port impedances shown in Table 2 are not equal. Although the port impedances can be made identical by using transformers (not shown), the port impedances shown in Table 2 are more suitable for high power amplifiers where the load line and input impedance are considerably less than 50 ohms.

The unwanted even transmission line mode is formed between the shield of the coaxial transmission line and the ground of the circuit. A judicious use of ferrite was assumed to minimize this problem in the prior art schematic shown in FIG. 2 and likewise in the ideal combiner/splitter shown in FIGS. 5 and 6. The unwanted even mode currents are therefore assumed negligible and the performance is determined by only the components identified in the schematics.

Returning to FIG. 2, note that the prior art shows a tapped transformer T2 and capacitor, C2, to approximate the necessary ideal transformer with a turns ratio of the square root of three required when all ports are set equal to 50 ohms. Unfortunately, this technique is only suitable at HF frequencies where winding capacitance is not appreciable.

Figure 7:
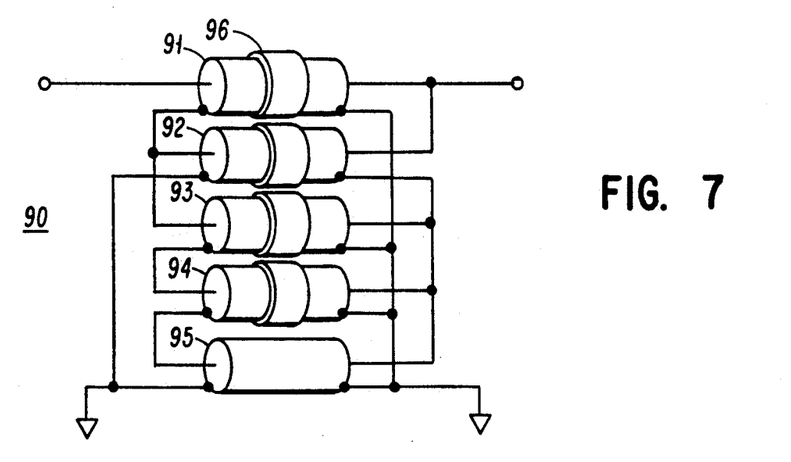
FIG. 7 is a schematic diagram of a transmission line transformer of the present invention.

A novel transmission line transformer suitable for VHF/UHF frequencies is shown in FIG. 7. The transformer 90 is completely broadband except for even mode degradation and thus serves as a natural complement to the combiner/splitter shown in FIGS. 5 and 6. Since transformers must have rational turns ratio, the ratio selected was 7/4=1.75. This is within 1% of the ideal turns ratio of square root of three required when all ports are 50 ohms. The resulting degraded input VSWR is only 1.02:1 (return loss=40 dB).

While the transmission lines 91–95 shown in FIG. 7 are coaxial, twin lines may also be used. For either case a ferrite sleeve 96 is required around each transmission line 91–94. The required impedance values for FIG. 7 are as follows:

| Input Port | $= R_S$ | = 50.00 Ohms |
|---|---|---|
| Output Port.. | $= R_S/3.063$ | = 16.33 Ohms |
| Transmission Line Zo's | $= R_S/1.750$ | = 28.57 Ohms |

Figure 8:
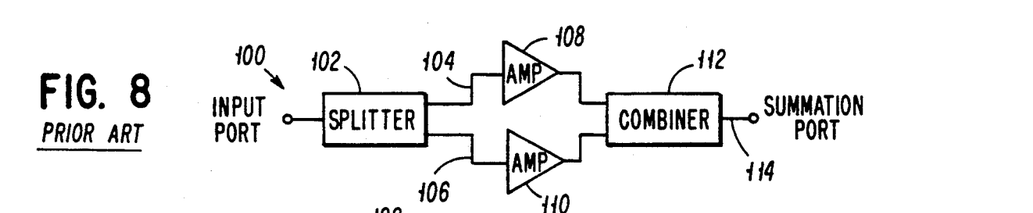
FIG. 8 is a block diagram of a quadrature combiner/splitter for summing the power output of two amplifiers as known in the prior art.

FIG. 8 illustrates a block diagram of a 2-port quadrature combiner/splitter binary system using 90° offset phasors. An input signal 100 is coupled through a splitter 102 having outputs 104, 106 coupled to amplifiers 108, 110. The output of amplifiers 108 and 110 are coupled through combiner 112 yielding an output signal at summation port 114. The difference in phase between port-2 and port-3 remains at 90° over the bandwidth of the combiner/splitter.

The ideal S parameter matrix is:

$$\begin{bmatrix} S_{11} & S_{12} & S_{13} \\ S_{21} & S_{22} & S_{23} \\ S_{31} & S_{32} & S_{33} \end{bmatrix}$$

Where the splitter ports are identified in FIG. 8 as:

$$S_{11} = S_{22} = S_{33} = S_{23} = S_{32} = 0$$

$$S_{12} = S_{21} = 1/\sqrt{2} \ \angle 0°$$

$$S_{13} = S_{31} = 1/\sqrt{2} \ \angle 90°$$

The 90° signal offset of quadrature combiners results in a very useful property for amplifier design. Namely, that if both of the output ports are terminated in a mismatched load with a reflection coefficient p, the input port reflection coefficient, $P_{IN}$, is equal to zero. Mathematically, this means that for two equal amplitude phasors $P_{IN} = p/2 \ \angle 2\cdot 90° + p/2 \ \angle 2\cdot 0° = 0$. Note that the phase of transfer coefficients $S_{12}=S_{21}$ and $S_{13}=S_{31}$ are multiplied by two and the magnitude of the coefficients are squared corresponding with the wave travel to and from the output ports.

In summary, if the impedance mismatch at the input of the amplifiers 108 and 110 in FIG. 8 has approximately the same magnitude and phase, the combiner input VSWR is approximately 1:1. This same property results in cancellation of intermodulation products caused by a signal introduced at the summation port 114, also known as back door intermodulation.

Figure 9:
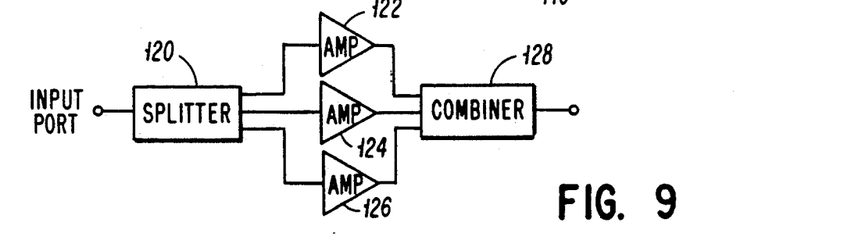
FIG. 9 is a block diagram of a tri-phase combiner/splitter system of the present invention.

FIG. 9 illustrates a tri-phase system that utilizes the concept discussed in FIG. 8. The FIG. 9 circuitry depicts a three port splitter 120, three amplifiers 122, 124, and 126 and a three port combiner 128. The tri-phase system shown in FIG. 9 can also have the ideal input port VSWR of 1:1 and the back-door intermodulation cancellation property discussed above.

The S parameter matrix for the tri-phase system is $$\begin{bmatrix} S_{11} & S_{12} & S_{13} & S_{14} \\ S_{21} & S_{22} & S_{23} & S_{24} \\ S_{31} & S_{32} & S_{33} & S_{34} \\ S_{41} & S_{42} & S_{43} & S_{44} \end{bmatrix}$$

Where the splitter ports are identified in FIG. 9

$$S_{11} = S_{22} = S_{33} = S_{44} = 0$$

$$S_{23} = S_{32} = S_{24} = S_{42} = S_{34} = S_{43} = 0$$

(For 60° Offset)

$$S_{12} = S_{21} = 1/\sqrt{3} \ \angle 0°$$

$$S_{13} = S_{31} = 1/\sqrt{3} \ \angle 60°$$

$$S_{14} = S_{41} = 1/\sqrt{3} \ \angle 120°$$

(For 120° Offset)

$$S_{12} = S_{21} = 1/\sqrt{3} \ \angle 0°$$

$$S_{13} = S_{31} = 1/\sqrt{3} \ \angle 120°$$

$$S_{14} = S_{41} = 1/\sqrt{3} \ \angle 240°$$

Note that unlike the 90° offset of binary combiners, the transfer coefficients $S_{12}=S_{21}$, $S_{13}=S_{31}$, and $S_{14}=S_{41}$ shown above have either 60° or 120° offset. As shown below, these are the only possible choices for cancelling three equal amplitude reflected phasors.

The sum of the reflected phasors for 60° offset:

$$P_{IN} = p/3 \ \angle 2\cdot 0° + p/3 \ \angle 2\cdot 60° + p/3 \ \angle 2\cdot 120° = 0$$

The sum of the reflected phasors for 120° offset:

$$P_{IN} = p/3 \angle 2^*0° + p/3 \angle 2^*120° + p/3 \angle 2^*240° = 0$$

Figure 10:
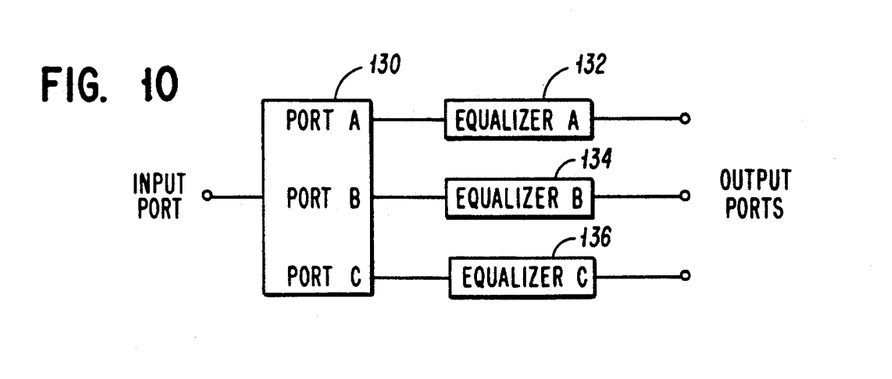
FIG. 10 is a block diagram of the 60° or 120° combiner/splitter of the present invention.

FIG. 10 shows a block diagram of a 60° or 120° offset combiner/splitter. The input splitter block 130 can be any 0° splitter but preferably for wideband high frequency and high power requirements devices such as the ones depicted in FIGS. 5 and 6 should be used. A first, second and third phase equalizer blocks 132, 134 and 136, respectively, shown in FIG. 10 are used to achieve the desired phase offset between Ports A, B, and C of splitter 130.

Figure 11A:
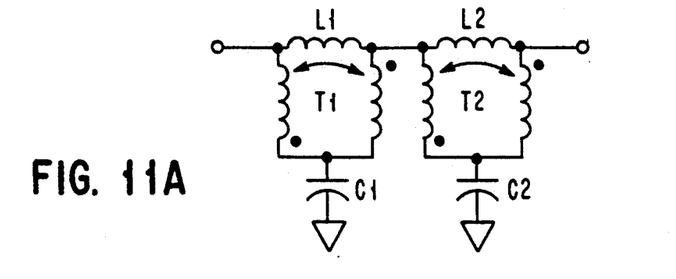
Figure 11B:
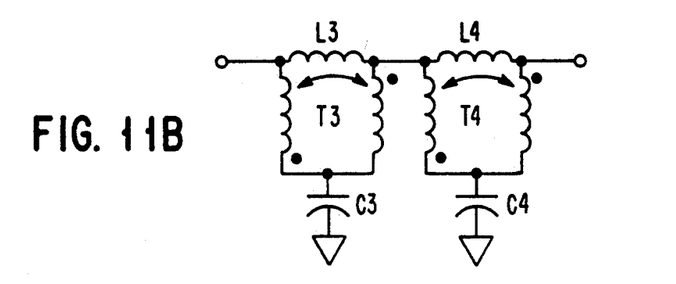
Figure 11C:
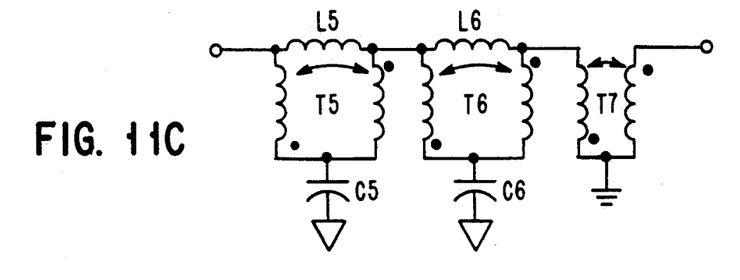

FIGS. 11A, 11B and 11C illustrate schematics of acceptable equalizers for either the 60° or 120° designs. Each equalizer is depicted as having a plurality of transformers $T_X$, inductors $L_X$ and capacitors $C_X$, configured as shown. Individual component values for the schematic shown in FIG. 11 which provide a ±6° phase error over a 2 to 30 Mhz bandwidth are given in Table 3.

TABLE 3

COMPONENT VALUES FOR THE TRI-PHASE COMBINER/SPLITTER SHOWN IN FIG. 11 FOR A BANDWIDTH OF 2 TO 30 Mhz

| Component | 60° Offset Value (nH) | 120° Offset Value (nH) |
|---|---|---|
| $L_1$ | 7,920.0 | 2,860.0 |
| $L_2$ | 533.0 | 197.0 |
| $L_3$ | 21,600.0 | 21,600.0 |
| $L_4$ | 1,450.0 | 1,450.0 |
| $L_5$ | 2,860.0 | 7,920.0 |
| $L_6$ | 197.0 | 533.0 |
| $C_1$ | 3,170.0 | 1,160.0 |
| $C_2$ | 213.0 | 78.8 |
| $C_3$ | 8,620.0 | 8,620.0 |
| $C_4$ | 579.0 | 579.0 |
| $C_5$ | 1,160.0 | 3,170.0 |
| $C_6$ | 78.8 | 213.0 |

All transformers in FIG. 11 are assumed ideal with a 1:1 turns ratio. The transformer $T_7$ on equalizer 11C shifts the phase 180° relative to equalizers 11A and 11B. A close examination of Table 3 shows that the same component values are required for either 60° or 120° offset. The only difference is that the 180° phase reversal transformer is used with a different set of component values for the two cases. This relationship can easily be shown either mathematically or graphically. Since both cases result in identical synthesis complexity and phase errors, either phase equalization system is therefore equally effective.

If the ±6° phase error is unsatisfactory, an additional equalizer section can be added. For example, if less than ±1° error is required, an additional section consisting of 1 coil, 1 capacitor and 1 transformer can be cascaded to each of the 3 equalizers shown in FIG. 11. Rather than a complex mathematical synthesis, the component values are readily found by computer optimization with a mini-max error criteria.

Figure 12:
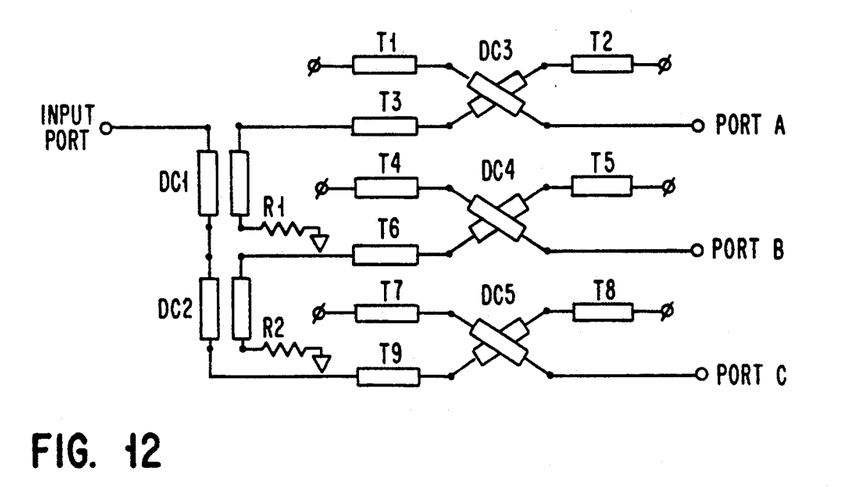
FIG. 12 is a schematic diagram of a coupled line tri-phase combiner/splitter.

At UHF and microwave frequencies the lumped 0° combiner/splitters of FIGS. 2, 5 and 6 are not realizable. FIG. 12 shows a 3-port splitter/combiner using two directional couplers, DC1 and DC2. Output ports P1 and P2 feed transmission lines T3, T6 and T9 with relative phases of 0°, 90° and 180° respectively. The electrical lengths of transmission lines T3, T6 and T9 are chosen to correct the relative phase differential from 90° to 60° at the center frequency. The outputs of T3, T6 and T9 are in turn connected to paired quadrature directional couplers DC3, DC4, and DC5 respectively, which serve as phase equalizers in the combiner/splitter of FIG. 12.

Figure 13:
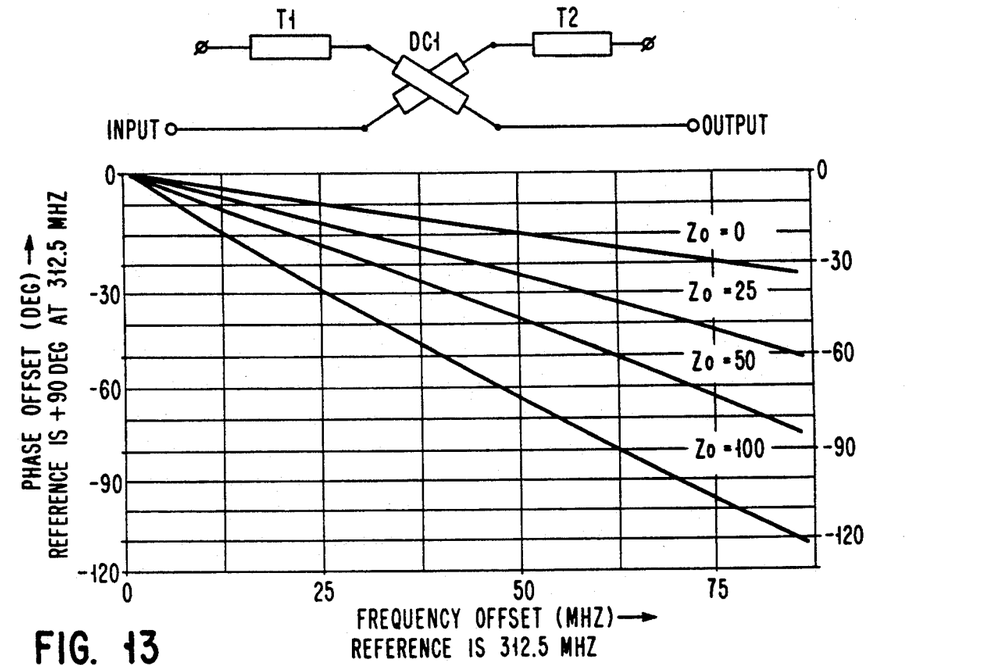
FIG. 13 is a schematic diagram of an open circuit coupled line phase equalizer and phase versus frequency offset plot.

Each of the three equalizers shown in FIG. 12 uses a new type of transmission line equalizer shown in FIG. 13. The quadrature coupler, DC1, has arithmetic symmetry at the arithmetic center of the band (e.g. 312.5 Mhz for the band 225 to 400 Mhz). By using two identical loads on the opposite ports, the transmission loss between the input and output ports remains essentially zero dB across the passband. The transmission phase characteristic however, varies as shown in FIG. 13 for various values of characteristic impedance of open circuit transmission lines, T1 and T2. Similarly, FIG. 14 shows transmission phase characteristic for various values of short circuit transmission lines T1 and T2.

Figure 14:
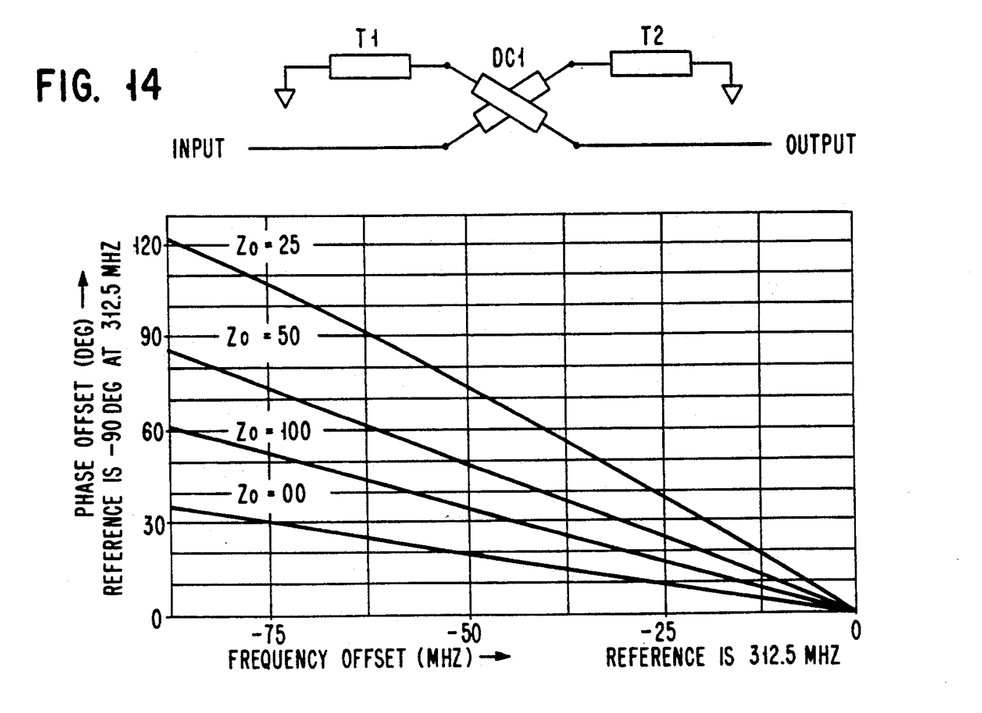
FIG. 14 is a schematic diagram of a closed circuit coupled line phase equalizer and phase versus frequency offset plot.

Although equalizers using short circuit lines such as shown in FIG. 14 are also possible, the open circuit lines are preferred for stripline construction since plated through holes are unnecessary. It should be noted that the entire synthesis of FIG. 12 is feasible using meandering microstrip lines and on a single substrate.

Component values for the schematic shown in FIG. 12 which result in less than ±1° phase error over a 225 to 400 Mhz bandwidth are given in Table 4. While both the 60° and 120° offset designs are theoretically equally effective in terms of equalizer operation, the 60° design has the advantage of more readily realizable transmission line impedance values than the 120° design (see T1, T2, T4, T5, T7 and T8 in Table 4).

TABLE 4

COMPONENT VALUES FOR THE TRI-PHASE COMBINER/SPLITTER SHOWN IN FIG. 12 FOR A BANDWIDTH OF 225 TO 400 Mhz

| Component Transmission Line | 60° Offset Value | 120° Offset Value |
|---|---|---|
| | (Ohms) | (Ohms) |
| $Z_o$ for T1 | 31.9 | 47.1 |
| $Z_o$ for T2 | 31.9 | 47.1 |
| $Z_o$ for T3 | 50.0 | 50.0 |
| $Z_o$ for T4 | 22.9 | 20.9 |
| $Z_o$ for T5 | 22.9 | 20.9 |
| $Z_o$ for T6 | 50.0 | 50.0 |
| $Z_o$ for T7 | 31.0 | 12.6 |
| $Z_o$ for T8 | 31.0 | 12.6 |
| $Z_o$ for T9 | 50.0 | 50.0 |
| | (Degree's) | (Degree's) |
| E1 for T1 | 90.0 | 90.0 |
| E1 for T2 | 90.0 | 90.0 |
| E1 for T3 | 60.0 | 0.0 |
| E1 for T4 | 90.0 | 90.0 |
| E1 for T5 | 90.0 | 90.0 |
| E1 for T6 | 30.0 | 30.0 |
| E1 for T7 | 90.0 | 90.0 |
| E1 for T8 | 90.0 | 90.0 |
| E1 for T9 | 0.0 | 60.0 |

Where:

Z0 = Characteristic Impedance in Ohms of Transmission Line

E1 = Electrical Length in °'s of Transmission Line at the Arithmetic Center of the Frequency Band

| Component Directional Coupler | Value (Ohms) |
|---|---|
| $Z_{ODD}$ for DC1 | 25.1 |
| $Z_{EVEN}$ for DC1 | 99.5 |
| $Z_{ODD}$ for DC2 | 19.5 |
| $Z_{EVEN}$ for DC2 | 128.0 |
| $Z_{ODD}$ for DC3 | 19.5 |
| $Z_{EVEN}$ for DC3 | 128.0 |

-continued

| | |
|---|---|
| $Z_{ODD}$ for DC4 | 19.5 |
| $Z_{EVEN}$ for DC4 | 128.0 |
| $Z_{ODD}$ for DC5 | 19.5 |
| $Z_{EVEN}$ for DC5 | 128.0 |

| Resistors | Ohms |
|---|---|
| R1 | 50.0 |
| R2 | 50.0 |

Where $Z_{ODD}$=Odd Mode Impedance of Directional Coupler $Z_{EVEN}$=Even Mode Impedance of Directional Coupler The electrical length of all directional couplers is 90° at the arithmetic center of the frequency band (312.5 Mhz)

It is thought that the apparatus and method of the present invention and many of its attendant advantages will be understood from the foregoing description, and it will be apparent that various changes may be made in the form, construction and arrangement of the parts and the steps thereof without departing from the spirit and scope of the invention, or sacrificing all their material advantages, the forms described herein being merely preferred embodiments thereof.

I claim:

1. A tri-phase combiner splitter comprising:
   a first and second directional coupler means serially coupled providing three output signals;
   first second and third phase equalizer means coupled to the first second and third output signals respectively;
   first, second and third quadrature couplers each having an input from one of the phase equalizers;
   paired transmission line load means coupled to each of said quadrature couplers; and
   first, second and third output ports from quadrature couplers;
   wherein phase error over a given bandwidth is approximately one degree.

2. The apparatus of claim 1 wherein the phase equalizer means is comprised of a plurality of transformers and capacitors.

3. The apparatus of claim 1 wherein the paired transmission line load means are open circuited.

4. The apparatus of claim 1 further comprising a pair of resistors respectively coupled to the first and second directional coupler means.

* * * * *